(12) United States Patent
Rong

(10) Patent No.: US 11,074,384 B1
(45) Date of Patent: Jul. 27, 2021

(54) METHOD FOR SIMULATING SIGNAL INTEGRITY OF HYBRID MODEL

(71) Applicant: ZHENGZHOU YUNHAI INFORMATION TECHNOLOGY CO., LTD., Henan (CN)

(72) Inventor: Shili Rong, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 508 days.

(21) Appl. No.: 16/097,217

(22) PCT Filed: Dec. 28, 2017

(86) PCT No.: PCT/CN2017/119201
§ 371 (c)(1),
(2) Date: Oct. 26, 2018

(87) PCT Pub. No.: WO2019/029105
PCT Pub. Date: Feb. 14, 2019

(30) Foreign Application Priority Data

Aug. 10, 2017 (CN) .......................... 201710681407.9

(51) Int. Cl.
*G06F 30/36* (2020.01)
*G06F 30/367* (2020.01)

(52) U.S. Cl.
CPC ................. *G06F 30/367* (2020.01)

(58) Field of Classification Search
None
See application file for complete search history.

(56) References Cited

U.S. PATENT DOCUMENTS

| 9,542,516 B1 * | 1/2017 | Chen ................... G06F 30/3323 |
| 2003/0182640 A1 * | 9/2003 | Alani ................... G06F 30/367 |
| | | 716/115 |
| 2011/0257953 A1 | 10/2011 | Li |
| 2013/0041645 A1 | 2/2013 | Kawata |

FOREIGN PATENT DOCUMENTS

| CN | 1691020 A | 11/2005 |
| CN | 102314532 A | 1/2012 |
| CN | 102870094 A | 1/2013 |

OTHER PUBLICATIONS

International Search Report for PCT/CN2017/119201 dated Apr. 23, 2018, ISA/CN.

* cited by examiner

*Primary Examiner* — Craig C Dorais
(74) *Attorney, Agent, or Firm* — Yue (Robert) Xu; Apex Attorneys at Law, LLP

(57) ABSTRACT

A method for simulating signal integrity of a hybrid model is provided, which includes: establishing a transient simulation link including a front-end chip model, a pre-link model and a terminating impedance model, where the front-end chip model is a Spice model; inputting an ideal step signal to a port reserved in the front-end chip model, and extracting step response data in a steady state; inputting the step response data to an input end of a channel simulation link, where the channel simulation link includes a relay chip model, a post-link model and a back-end chip model, and each of the relay chip model and the back-end chip model is an IBIS AMI model; and inputting a random code signal to the input end of the channel simulation link, and reading a signal outputted from an output end of the back-end chip and forming an eye pattern.

6 Claims, 1 Drawing Sheet

---

| Establish a transient simulation link and a channel simulation link | S101 |

↓

| Input an ideal step signal to a port reserved in a front-end chip, and extract step response data in a steady state outputted from a tail end of a pre-wiring model | S102 |

↓

| Input the step response data to an input end of the channel simulation link, and then input a random code signal to the input end of the channel simulation link, and read a signal outputted from an output end of a back-end chip and form an eye pattern | S103 |

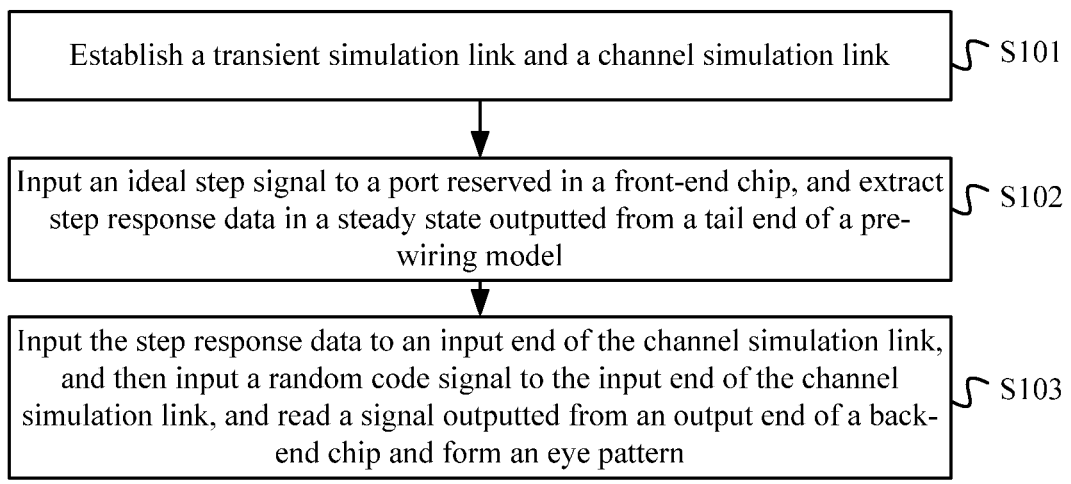

METHOD FOR SIMULATING SIGNAL INTEGRITY OF HYBRID MODEL

This application is a national phase application of PCT international patent application PCT/CN2017/119201, filed on Dec. 28, 2017 which claims the priority to Chinese Patent Application No. 201710681407.9, titled "METHOD FOR SIMULATING SIGNAL INTEGRITY OF HYBRID MODEL", filed on Aug. 10, 2017 with the Chinese Patent Office, both of which are incorporated herein by reference in their entireties.

FIELD

The present disclosure relates to the technical field of chip simulation test, and in particular to a method for simulating signal integrity of a hybrid model.

BACKGROUND

In designing a digital system, a simulation test method is required to evaluate a link formed by chips of different manufacturers. In order to implement simulation test, each of the chip suppliers provides a chip model, and an engineer for testing signal integrity establishes a test link for link evaluation based on the chip models. At present, many types of chip models are provided by the manufacturers, such as the Spice model and the IBIS AMI model. Because the Spice model has a different design principle from the IBIS AMI model, the Spice model for simulating a front-end chip cannot realize channel simulation with the IBIS AMI model for simulating a relay chip and a back-end chip.

In order to solve the problem that the Spice model for a transmitter chip cannot realize the channel simulation with the IBIS AMI model for the relay chip, a general model is used to approximately replace the Spice model in the conventional technology, and the general model and the Spice model have approximate characteristics through parameter setting, to implement signal simulation.

However, simulation accuracy may be affected in approximate simulation realized by the general model, especially in a case that quality allowance of a link signal is small, actual link characteristics cannot be characterized with the simulation test. In addition, because the Spice model provided by some manufacturers is special and is difficult to be approximated to the general model, active simulation cannot be performed, and risk assessment can be performed only depending on experience.

SUMMARY

A method for simulating signal integrity of a hybrid model is provided in the present disclosure, to solve the problem that a simulation result is greatly different from signal integrity of an actual link formed by chips in a case that link signal integrity simulation is performed on a link including the IBIS AMI model and a general model for preliminarily replacing the Spice model as a front-end chip model.

A method for simulating signal integrity of a hybrid model is provided according to an embodiment of the present disclosure, which includes: establishing a transient simulation link, where the transient simulation link includes a front-end chip model, a pre-link model arranged at an output end of the front-end chip model and a terminating impedance model arranged at a tail end of the pre-link model, and the front-end chip model is a Spice model; inputting an ideal step signal to a port reserved in the front-end chip model, and extracting step response data in a steady state outputted from the tail end of the pre-link model; inputting the step response data to an input end of a channel simulation link, where the channel simulation link includes a relay chip model, a back-end chip model and a post-link model for connecting the relay chip model and the back-end chip model, and each of the relay chip model and the back-end chip model is an IBIS AMI model; and inputting a random code signal to the input end of the channel simulation link, and reading a signal outputted from an output end of the back-end chip and forming an eye pattern.

Optionally, the pre-link model and/or the post-link model is a model using S-parameters.

Optionally, the pre-link model and/or the post-link model is a wiring model having a length of 5 inches.

Optionally, the method further includes reading a signal outputted from an output end of the post-link model and forming an eye pattern.

A transient simulation link is established to acquire step response data for simulating characteristics of the Spice model for a front-end chip and the pre-link model, and the step response data is inputted to a channel simulation link, so that a signal in the channel simulation link have characteristics of the front-end chip and the pre-link model. In this way, the Spice model for characterizing characteristics of the front-end chip and the IBIS model for characterizing characteristics of a relay chip and a back-end chip can be connected, so that a simulation test result includes characteristics of the front-end chip, a pre-link, the relay chip, a post-link, and the back-end chip, thereby implementing channel simulation for a preset chip.

BRIEF DESCRIPTION OF THE DRAWINGS

In order to more clearly illustrate the technical solution in the present disclosure, the drawings required in the embodiment are introduced simply below. Apparently, other drawings may be obtained by those skilled in the art based on the provided drawings without creative efforts.

FIG. 1 is a flowchart of a method for simulating signal integrity of a hybrid model according to an embodiment of the present disclosure.

DETAILED DESCRIPTION

In order to make those skilled in the art better understand the technical solution in the present disclosure, the technical solution according to the embodiment of the present disclosure is described clearly and completely as follows in conjunction with the drawings in the embodiment of the present disclosure. It is apparent that the described embodiment is only a part rather than all of the embodiments according to the present disclosure. Any other embodiments obtained by those skilled in the art based on the embodiment in the present disclosure without any creative effort fall within the protection scope of the present disclosure.

A method for simulating signal integrity of a hybrid model is provided according to an embodiment of the present disclosure, in which, the Spcie model is used to simulate a front-end chip, and the IBIS AMI model is used to simulate a relay chip and a back-end chip, to test signal quality of a link formed by the front-end chip, the relay chip and the back-end chip.

FIG. 1 is a flowchart of a method for simulating signal integrity of a hybrid model according to an embodiment of the present disclosure.

The method according to the embodiment includes following steps S101 to S103.

In step S101, a transient simulation link and a channel simulation link are established.

Since signal integrity simulation cannot be performed on a channel simulation link composed of the Spice model for simulating a front-end chip and the IBIS AMI model for simulating a relay chip and a back-end chip, a transient simulation link is established for the Spcie model for the front-end chip in the embodiment, and step response data for characterizing characteristics (that is, characteristics of the front-end chip) of the Spice model is acquired using the transient simulation link.

The transient simulation link includes the Spice model for characterizing the front-end chip, a pre-link model arranged at an output end of the Spice model, and a terminating impedance model arranged at an output end of the pre-link model. The pre-link model is configured to simulate a printed circuit for connecting different chips on a printed circuit board. The terminating impedance model is configured to simulate terminating impedance at the output end, which avoids signal reflection caused by discontinuous impedance, thereby ensuring accuracy or representativeness of the step response data acquired by transient simulation.

The channel simulation link includes a relay chip IBIS AMI model for simulating the relay chip, a back-end chip IBIS AMI model for simulating the back-end chip, and a post-link model for connecting the relay chip IBIS AMI model and the back-end chip IBIS AMI model. The post-link model is also configured to simulate a printed circuit for connecting different chips on a printed circuit board.

In step S102, an ideal step signal is inputted to a port reserved in the front-end chip model, and step response data in a steady state is extracted from a tail end of the pre-link model.

After the transient simulation link is established as described above, the step response data for characterizing characteristics of the front-end link model and the pre-link model may be acquired using the transient simulation link. The ideal step response signal is inputted to the port reserved in the front-end chip model, and signal amplitude of the ideal step response signal is determined based on characteristics of the chip. The ideal step response signal is not inputted until the step response data outputted from the tail end of the pre-link model reaches the steady state. It should be noted that, the step response data is extracted with a sampling frequency, to ensure good smoothness of the acquired data, so that the step response data can characterize actual characteristics of the front-end chip model and the pre-link model.

In step S103, the step response data is inputted to an input end of the channel simulation link, and then a random code signal is inputted to the input end of the channel simulation link, and a signal outputted from an output end for the back-end chip is read, and an eye pattern is formed.

After the step response data of the Spice model for simulating the front-end chip is acquired and inputted into the channel simulation link, the step response data is processed in the channel simulation link to generate a response state. Therefore, the front-end Spice model can affect an output signal acquired by processing a random code signal using the channel simulation link having the response state described above. After an eye pattern is formed based on the signal outputted by the back-end chip in the channel simulation link, transmission states of the signal in the front-end chip, a pre-link, the relay chip, a post-link, and a post chip and quality of the output signal can be evaluated based on the eye pattern.

It should be noted that, in other embodiments, the channel simulation link may also be established after the step response data is acquired.

In a practical test, a simulation frequency, a code type, equalization and the like of the random code signal are set according to a preliminary setting requirement, to determine a response of a link formed by actual chips to a specific type of a standard signal to be processed. In an application of the embodiment, a signal in the PCIE Gen3 standard is processed in the link formed by chips, and a frequency of a random code is set to be 8 GHz.

In the embodiment, the transient simulation link and the channel simulation link are established using simulation test software. In the embodiment, ADS software is used in the simulation described above. A Spice Wizard function module in the ADS software is used to establish the transient simulation link, and a channel simulation module in the ADS software is used to establish the channel simulation link.

In a practical application, a signal link may include various components such as a via hole, a connector and a cable, and overall S-parameters of the components may be extracted with software. In order to facilitate verification, a wiring model having a length of 5 inches is selected in the embodiment as the pre-link model and the post-link model.

The method for simulating signal integrity of the hybrid model according to the embodiment of the present disclosure is described in detail. The principles and the embodiments of the present disclosure are described based on the specific embodiment. The above embodiment is illustrated only for helping understand the core concept of the present disclosure. Without deviating from the principles of the present disclosure, all other embodiments obtain by those skilled in the art without creative efforts fall within the protection scope of the present disclosure.

The invention claimed is:

1. A method for simulating signal integrity of a hybrid model, comprising:
    establishing a transient simulation link, wherein the transient simulation link comprises a front-end chip model, a pre-link model arranged at an output end of the front-end chip model and a terminating impedance model arranged at a tail end of the pre-link model, and the front-end chip model is a Spice model;
    inputting an ideal step signal to a port reserved in the front-end chip model, and extracting step response data in a steady state outputted from the tail end of the pre-link model;
    inputting the step response data to an input end of a channel simulation link, wherein the channel simulation link comprises a relay chip model, a back-end chip model and a post-link model for connecting the relay chip model and the back-end chip model, and each of the relay chip model and the back-end chip model is an IBIS AMI model; and
    inputting a random code signal to the input end of the channel simulation link, and reading a signal outputted from an output end of the back-end chip model and forming an eye pattern.

2. The method according to claim 1, wherein the pre-link model and/or the post-link model is a model using S-parameters.

3. The method according to claim 2, wherein the pre-link model and/or the post-link model is a wiring model having a length of 5 inches.

4. The method according to claim 1, further comprising: reading a signal outputted from an output end of the post-link model and forming an eye pattern.

5. The method according to claim 2, further comprising: reading a signal outputted from an output end of the post-link model and forming an eye pattern.

6. The method according to claim 3, further comprising: reading a signal outputted from an output end of the post-link model and forming an eye pattern.

\* \* \* \* \*